(12) United States Patent
Ooyabu et al.

(10) Patent No.: US 9,412,920 B2
(45) Date of Patent: Aug. 9, 2016

(54) PHOSPHOR REFLECTING SHEET, LIGHT EMITTING DIODE DEVICE, AND PRODUCING METHOD THEREOF

(75) Inventors: Yasunari Ooyabu, Osaka (JP); Hisataka Ito, Osaka (JP); Tsutomu Nishioka, Osaka (JP); Toshiki Naito, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/446,540

(22) Filed: Apr. 13, 2012

(65) Prior Publication Data

US 2012/0261700 A1    Oct. 18, 2012

(30) Foreign Application Priority Data

Apr. 14, 2011    (JP) .................................. 2011-089955

(51) Int. Cl.
*H01L 33/50*    (2010.01)
*H01L 33/56*    (2010.01)
(Continued)

(52) U.S. Cl.
CPC ................ *H01L 33/56* (2013.01); *H01L 24/97* (2013.01); *H01L 33/46* (2013.01); *H01L 33/505* (2013.01);
(Continued)

(58) Field of Classification Search
CPC ....... H01L 33/505; H01L 33/56; H01L 33/46; H01L 33/508; H01L 2224/48091; H01L 2224/45144; H01L 2224/16225; H01L 2224/73265; H01L 2924/00; H01L 2924/00014; H01L 2924/01322; H01L 23/28; H01L 2933/005; H01L 2933/0041; H01L 2933/0058; H01L 2933/0066; H01L 33/501; H01L 33/504; H01L 33/507; H01L 33/44; H01L 33/50; H01L 33/52; H01L 33/54; H01L 33/58; H01L 33/60; H01L 33/62; H01L 33/0095
USPC .................................................... 257/98, 99
See application file for complete search history.

(56) References Cited

U.S. PATENT DOCUMENTS 7,621,654 B2 * 11/2009 Nishimoto et al. ........... 362/241
2005/0139851 A1    6/2005 Sato
(Continued)

FOREIGN PATENT DOCUMENTS

EP    2 216 834 A1    8/2010
JP    2005-5604 A    1/2005
(Continued)

OTHER PUBLICATIONS

Extended European Search Report, dated Jul. 7, 2014, issued by the European Patent Office, in counterpart Application No. 12161746.8.
(Continued)

*Primary Examiner* — Julia Slutsker
*Assistant Examiner* — Natalia Gondarenko
(74) *Attorney, Agent, or Firm* — Sughrue Mion, PLLC

(57) ABSTRACT

A phosphor reflecting sheet provides a phosphor layer on one side in a thickness direction of a light emitting diode element and provides a reflecting resin layer at the side of the light emitting diode element. The phosphor reflecting sheet includes the phosphor layer and the reflecting resin layer provided on one surface in the thickness direction of the phosphor layer. The reflecting resin layer is formed corresponding to the light emitting diode element so as to be disposed in opposed relation to the side surface of the light emitting diode element.

6 Claims, 7 Drawing Sheets

(51) Int. Cl.
*H01L 33/46* (2010.01)
*H01L 23/00* (2006.01)

(52) U.S. Cl.
CPC ... *H01L 2224/16* (2013.01); *H01L 2924/12041* (2013.01); *H01L 2924/12042* (2013.01); *H01L 2924/15787* (2013.01); *H01L 2933/005* (2013.01)

(56) References Cited

U.S. PATENT DOCUMENTS

| | | |
|---|---|---|
| 2006/0118510 A1 | 6/2006 | Fujii |
| 2008/0117619 A1* | 5/2008 | Pang et al. ............ 362/84 |
| 2008/0283862 A1* | 11/2008 | Fujii ..................... 257/99 |
| 2008/0290351 A1 | 11/2008 | Ajiki et al. |
| 2009/0129055 A1* | 5/2009 | Morizawa et al. ...... 362/97.1 |
| 2009/0296389 A1* | 12/2009 | Hsu ...................... 362/235 |
| 2009/0321770 A1* | 12/2009 | Ajiki et al. ............. 257/98 |
| 2010/0051984 A1* | 3/2010 | West ..................... 257/98 |
| 2010/0104807 A1* | 4/2010 | Chiu et al. .............. 428/142 |
| 2010/0140640 A1* | 6/2010 | Shimokawa et al. ..... 257/98 |
| 2010/0264438 A1* | 10/2010 | Suenaga ................ 257/98 |
| 2010/0308361 A1* | 12/2010 | Beeson et al. .......... 257/98 |
| 2010/0320479 A1 | 12/2010 | Minato et al. |
| 2011/0291143 A1 | 12/2011 | Kim et al. |
| 2012/0138997 A1 | 6/2012 | Tasaki et al. |

FOREIGN PATENT DOCUMENTS

| | | | |
|---|---|---|---|
| JP | 2005-191420 A | | 7/2005 |
| JP | 2008-294224 A | | 12/2008 |
| JP | 2009-188207 A | | 8/2009 |
| JP | 2009188207 A | * | 8/2009 |
| JP | 2010-67641 A | | 3/2010 |
| JP | 2010-192844 A | | 9/2010 |
| KR | 10-2010-0080423 A | | 7/2010 |
| WO | 2009/069671 A1 | | 6/2009 |
| WO | 2010/150880 A1 | | 12/2010 |

OTHER PUBLICATIONS

Notification of Reasons for Refusal, dated May 20, 2014, issued by the Japanese Patent Office, in counterpart Application No. 2011-089955.
Notification of First Office Action dated Oct. 9, 2015, from the State Intellectual Property Office of the People's Republic of China in counterpart Application No. 201210111099.3.
Notification of Reasons for Refusal dated Nov. 24, 2015, from the Japanese Patent Office in counterpart application No. 2015-008967.
Office Action dated Nov. 18, 2015, from the Intellectual Property Office of Taiwan in counterpart application No. 101112854.
Notification of Second Office Action dated Jun. 2, 2016, issued by the State Intellectual Property Office of PR China in corresponding CN Application No. 201210111099.3.

* cited by examiner (a)

(b)

(c)

(d)

(e)

(a)

(b)

(c)

(d)

(d)

(e)

(f)

ered. It is an object of the present invention to provide a light emitting diode device that is capable of improving extraction efficiency of light, a producing method thereof, and a phosphor reflecting sheet used in the producing method.
PHOSPHOR REFLECTING SHEET, LIGHT EMITTING DIODE DEVICE, AND PRODUCING METHOD THEREOF

CROSS-REFERENCE TO RELATED APPLICATION

The present application claims priority from Japanese Patent Application No. 2011-089955 filed on Apr. 14, 2011, the contents of which are hereby incorporated by reference into this application.

BACKGROUND OF THE INVENTION

1. Field of the Invention

The present invention relates to a phosphor reflecting sheet, a light emitting diode device, and a producing method thereof, to be specific, to a producing method of a light emitting diode device, a phosphor reflecting sheet used in the producing method, and a light emitting diode device obtained by the producing method of the light emitting diode device.

2. Description of Related Art

In recent years, as a light emitting device that is capable of emitting high-energy light, a white light emitting device has been known. In the white light emitting device, for example, a diode board; an LED (light emitting diode) laminated thereon, emitting blue light; a phosphor layer that can convert the blue light into yellow light and covers the LED; and an encapsulating layer that encapsulates the LED are provided. The white light emitting device emits high-energy white light by color mixing of the blue light emitted from the LED, which is encapsulated by the encapsulating layer and to which electric power is supplied from the diode board, transmitting through the encapsulating layer and the phosphor layer, and the yellow light that is converted in wavelength from a part of the blue light in the phosphor layer.

As a method for producing the white light emitting device, for example, the following method has been proposed (ref: for example, Japanese Unexamined Patent Publication No. 2005-191420).

The proposed method is as follows. That is, a base, which has a board portion and a white reflecting frame portion protruding from the circumference portion thereof toward the upper side, is first formed. Next, a semiconductor light emitting element is subjected to a wire bonding in a bottom portion of a concave portion, which is formed at the center of the board portion by the reflecting frame portion, so as to be spaced apart from the inner side of the reflecting frame portion.

Next, a mixture of a phosphor and an epoxy resin in a liquid state is filled in the concave portion by application, subsequently the phosphor is spontaneously precipitated in the bottom portion of the concave portion, and then the epoxy resin is heat cured.

In the white light emitting device obtained by the method proposed in Japanese Unexamined Patent Publication No. 2005-191420, the phosphor layer (a wavelength conversion layer) that contains the phosphor formed by a precipitation at high concentrations is defined in a region at the upper side of the semiconductor light emitting element and an encapsulating portion that contains the epoxy resin at high concentrations is defined in a region at the upper side of the phosphor layer.

In the white light emitting device, the semiconductor light emitting element radially emits the blue light. Of the emitted blue light, a part thereof emitted from the semiconductor light emitting element toward the upper side is converted into the yellow light in the phosphor layer and the remaining light transmits through the phosphor layer. The blue light emitted from the semiconductor light emitting element toward the side is reflected at the reflecting frame portion and then toward the upper side. The white light emitting device in Japanese Unexamined Patent Publication No. 2005-191420 emits the white light by color mixing of the blue light and the yellow light.

SUMMARY OF THE INVENTION

However, in the white light emitting device obtained by the producing method in Japanese Unexamined Patent Publication No. 2005-191420, there is a disadvantage that the semiconductor light emitting element is spaced apart from the reflecting frame portion, so that a part of the light emitted from the semiconductor light emitting element toward the side is absorbed in the encapsulating portion before being reflected at the reflecting frame portion and as a result, extraction efficiency of the light is reduced.

It is an object of the present invention to provide a light emitting diode device that is capable of improving extraction efficiency of light, a producing method thereof, and a phosphor reflecting sheet used in the producing method.

A phosphor reflecting sheet of the present invention, for providing a phosphor layer on one side in a thickness direction of a light emitting diode element and providing a reflecting resin layer at the side of the light emitting diode element, includes the phosphor layer and the reflecting resin layer provided on one surface in the thickness direction of the phosphor layer, wherein the reflecting resin layer is formed corresponding to the light emitting diode element so as to be disposed in opposed relation to a side surface of the light emitting diode element.

When the phosphor reflecting sheet is laminated on a substrate so as to dispose the reflecting resin layer in opposed relation to the substrate and dispose the phosphor layer in opposed relation to the light emitting diode element, it is possible to bring the reflecting resin layer into close contact with the side surface of the light emitting diode element.

Therefore, in the obtained light emitting diode device, light emitted from the light emitting diode element to the side is reflected by the reflecting resin layer before being absorbed by another member.

By color mixing of the light emitted from the light emitting diode element and subjected to wavelength conversion by the phosphor layer, it is possible to emit high-energy white light.

As a result, the extraction efficiency of the light can be improved.

A method for producing a light emitting diode device of the present invention includes the steps of providing a reflecting resin layer on one surface in a thickness direction of a phosphor layer to prepare the above-described phosphor reflecting sheet, providing a light emitting diode element on one surface in the thickness direction of a substrate, forming a through hole in the substrate such that the through hole extends therethrough in the thickness direction thereof, laminating the phosphor reflecting sheet on the substrate so as to dispose the reflecting resin layer in opposed relation to the through hole and dispose the phosphor layer in opposed relation to one surface in the thickness direction of the light emitting diode element, reducing a pressure in the through hole, and bringing the reflecting resin layer into close contact with a side surface of the light emitting diode element.

In this method, the reflecting resin layer is brought into close contact with the side surface of the light emitting diode element. Therefore, in the obtained light emitting diode device, light emitted from the light emitting diode element to the side is reflected by the reflecting resin layer before being absorbed by another member.

In addition, the phosphor layer is disposed in opposed relation to one surface in the thickness direction of the light emitting diode element. Therefore, by color mixing of the light emitted from the light emitting diode element to one side in the thickness direction and subjected to wavelength conversion by the phosphor layer, it is possible to emit high-energy white light.

Also, according to this method, the pressure in the through holes is reduced. Therefore, it is possible to prevent the reflecting resin layer from fluidly moving into a region located on one side in the thickness direction of the light emitting diode element. This allows the phosphor layer to be reliably laminated on one surface in the thickness direction of the light emitting diode element. As a result, the light can be efficiently subjected to wavelength conversion by the phosphor layer.

In addition, by reducing the pressure in the through hole, air bubbles (voids) in the reflecting resin layer can be removed. Therefore, it is possible to form the reflecting resin layer with excellent reliability. In this way, the light can be efficiently reflected by the reflecting resin layer.

As a result, the extraction efficiency of the light can be improved.

In the method for producing the light emitting diode device of the present invention, it is preferable that the substrate is a diode board and in the step of providing the light emitting diode element on the substrate, the light emitting diode element is flip mounted on the substrate.

In this method, the light emitting diode element is flip mounted on the substrate, which is the diode board, and the reflecting resin layer is in close contact with the side surface of the light emitting diode element. Therefore, it is possible to easily produce the light emitting diode device.

In the method for producing the light emitting diode device of the present invention, it is preferable that the substrate is a release substrate, and the method for producing the light emitting diode device further includes the steps of peeling off the substrate from the light emitting diode element and the reflecting resin layer and flip mounting the light emitting diode element on the diode board.

In this method, the substrate, which is the release substrate, is peeled off from the light emitting diode element and the reflecting resin layer and the light emitting diode element having the side surface thereof in close contact with the reflecting resin layer is flip mounted on the diode board. Therefore, it is possible to easily and reliably produce the light emitting diode device.

A light emitting diode device of the present invention includes a diode board, a light emitting diode element flip mounted on the diode board, a phosphor layer laminated on one surface in a thickness direction of the light emitting diode element, and a reflecting resin layer in close contact with a side surface of the light emitting diode element.

In the light emitting diode device, light emitted from the light emitting diode element to the side is reflected by the reflecting resin layer before being absorbed by another member.

In addition, by color mixing of the light emitted from the light emitting diode element to one side in the thickness direction and subjected to wavelength conversion by the phosphor layer, it is possible to emit high-energy white light.

As a result, the extraction efficiency of the light can be improved.

(a) illustrating a step of preparing a phosphor reflecting sheet, (b) illustrating a step of forming through holes in a diode board and forming light emitting diode elements thereover, and (c) illustrating a step of laminating the phosphor reflecting sheet on the diode board.

Figure 2:
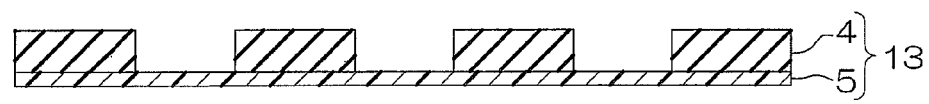
FIG. 2 shows process drawings for illustrating one embodiment of a method for producing the light emitting diode device of the present invention.
Figure 2:
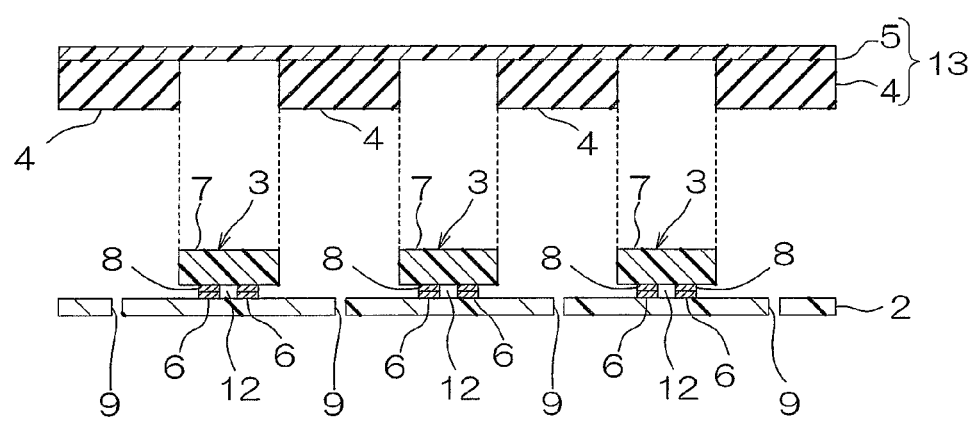
Figure 2:
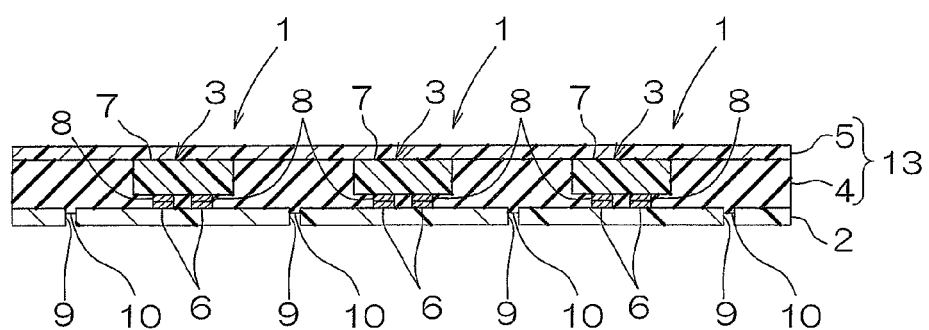
Figure 3:
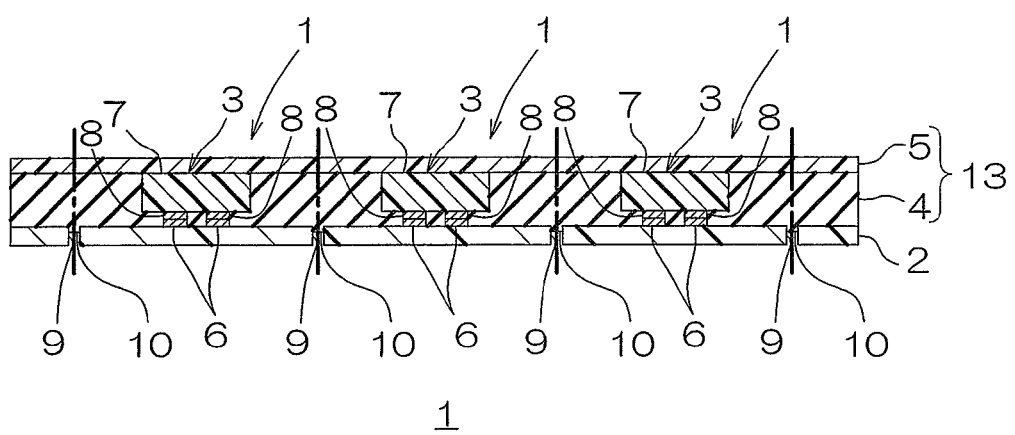
Figure 3:
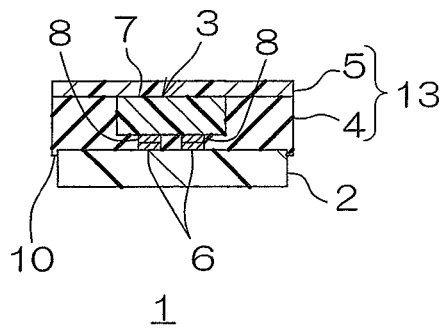

FIG. 3 shows process drawings for illustrating one embodiment of a method for producing the light emitting diode device of the present invention, subsequent to FIG. 2:

(d) illustrating a step of individualizing the light emitting diode elements and (e) illustrating a step of obtaining individualized light emitting diode devices.

Figure 4:
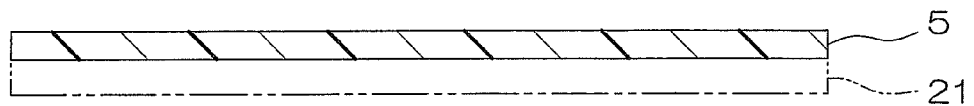
Figure 4:
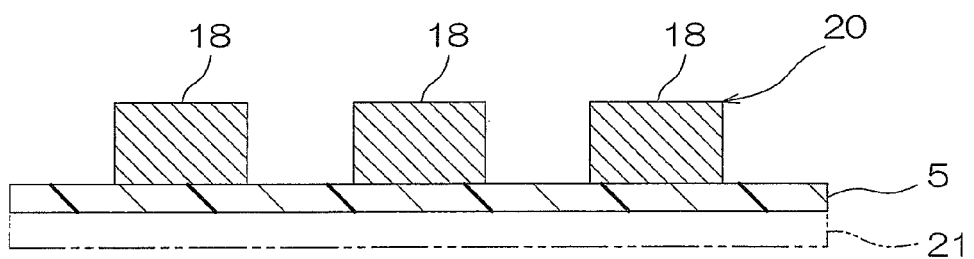
Figure 4:
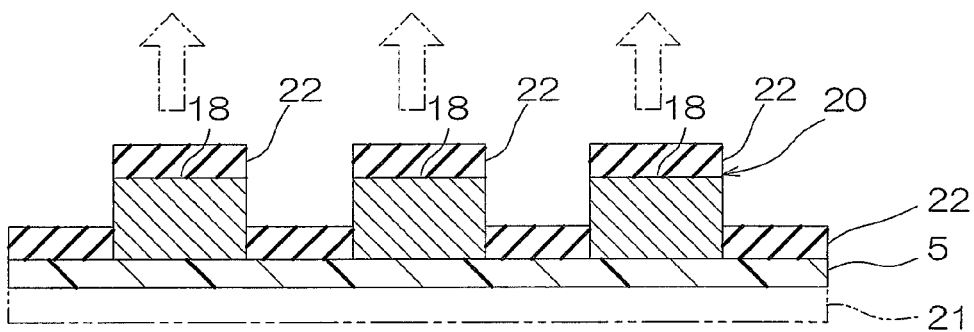
Figure 4:
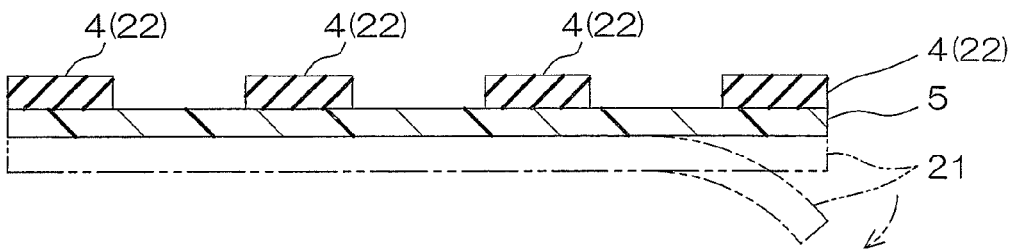

FIG. 4 shows process drawings for illustrating the steps of preparing the phosphor reflecting sheet in FIG. 2(a):

(a) illustrating a step of preparing a phosphor layer, (b) illustrating a step of disposing a mask on the phosphor layer, (c) illustrating a step of applying a reflecting resin composition on the phosphor layer via the mask, and (d) illustrating a step of removing the mask.

Figure 5:
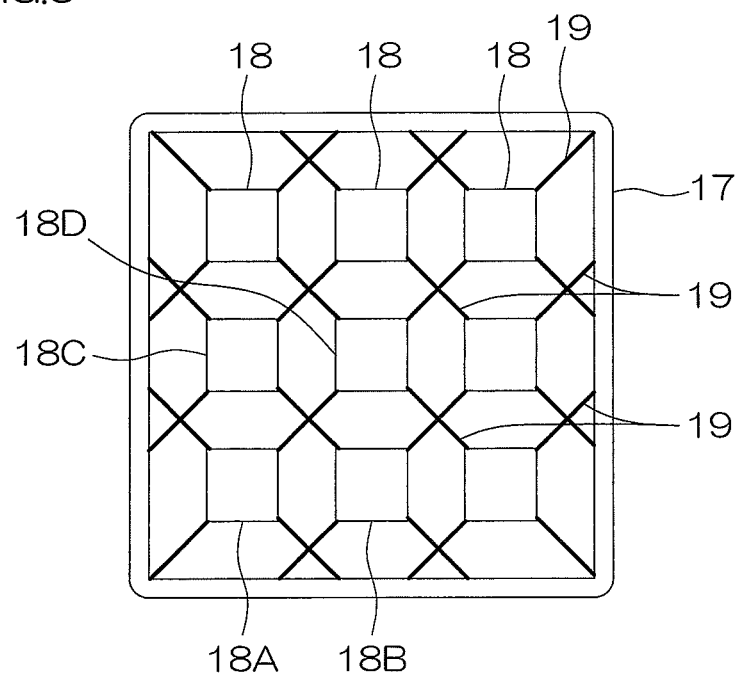
Figure 5:
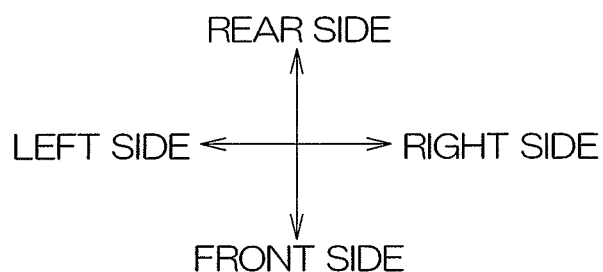

FIG. 5 shows a plan view of the mask disposed in the step in FIG. 4(b).

Figure 6:
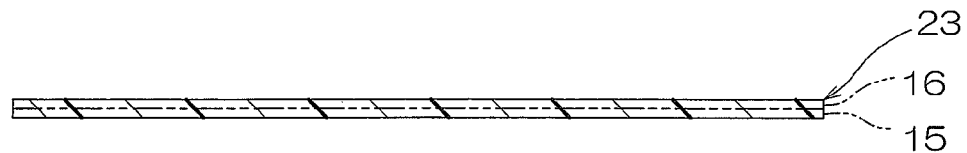
Figure 6:
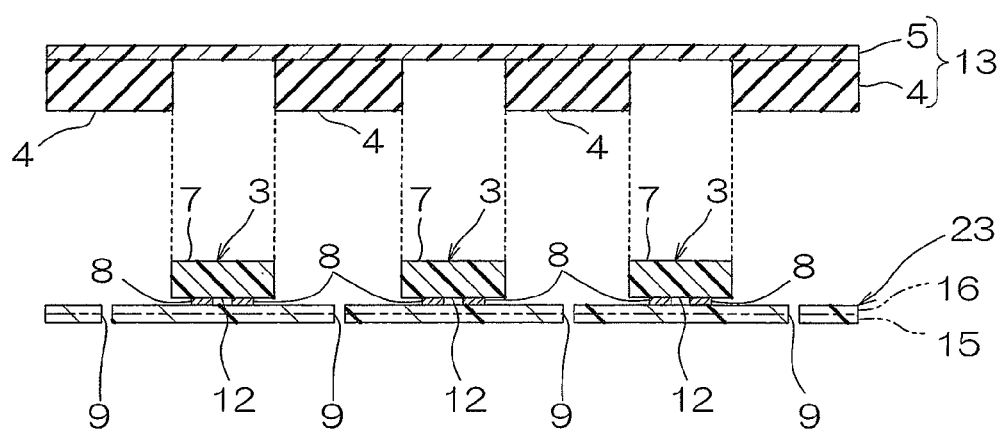
Figure 6:
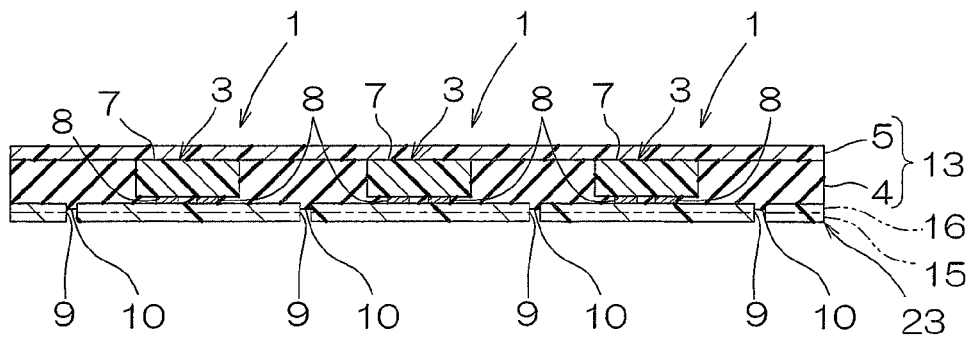

FIG. 6 shows process drawings for illustrating another embodiment (a method using a second release substrate) of a method for producing the light emitting diode device of the present invention:

(a) illustrating a step of preparing the second release substrate, (b) illustrating a step of forming through holes in the second release substrate and forming light emitting diode elements thereover, and (c) illustrating a step of laminating the phosphor reflecting sheet on the second release substrate.

Figure 7:
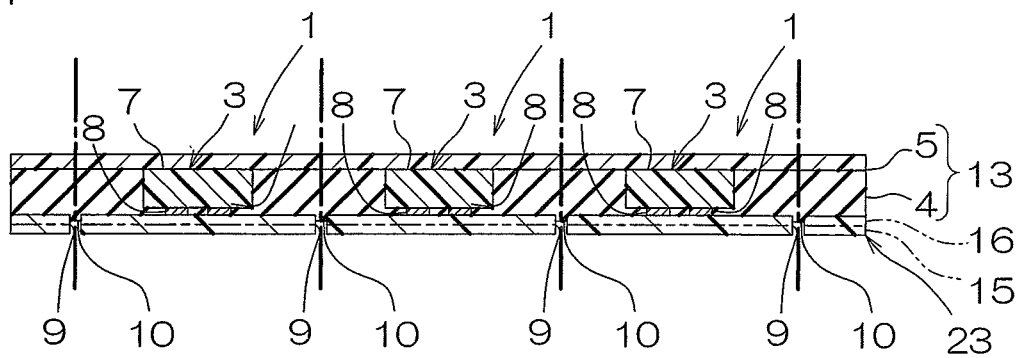
Figure 7:
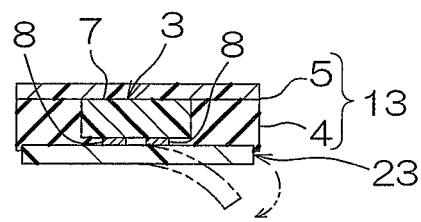
Figure 7:
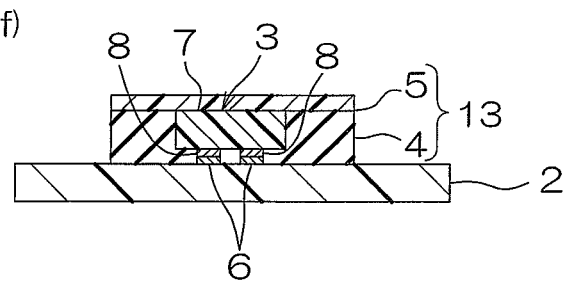

FIG. 7 shows process drawings for illustrating another embodiment (a method using the second release substrate) of a method for producing the light emitting diode device of the present invention, subsequent to FIG. 6:

(d) illustrating a step of individualizing the light emitting diode elements, (e) illustrating a step of peeling off the second release substrate, and (f) illustrating a step of flip mounting the light emitting diode elements on the diode board.

DETAILED DESCRIPTION OF THE INVENTION

Figure 1:
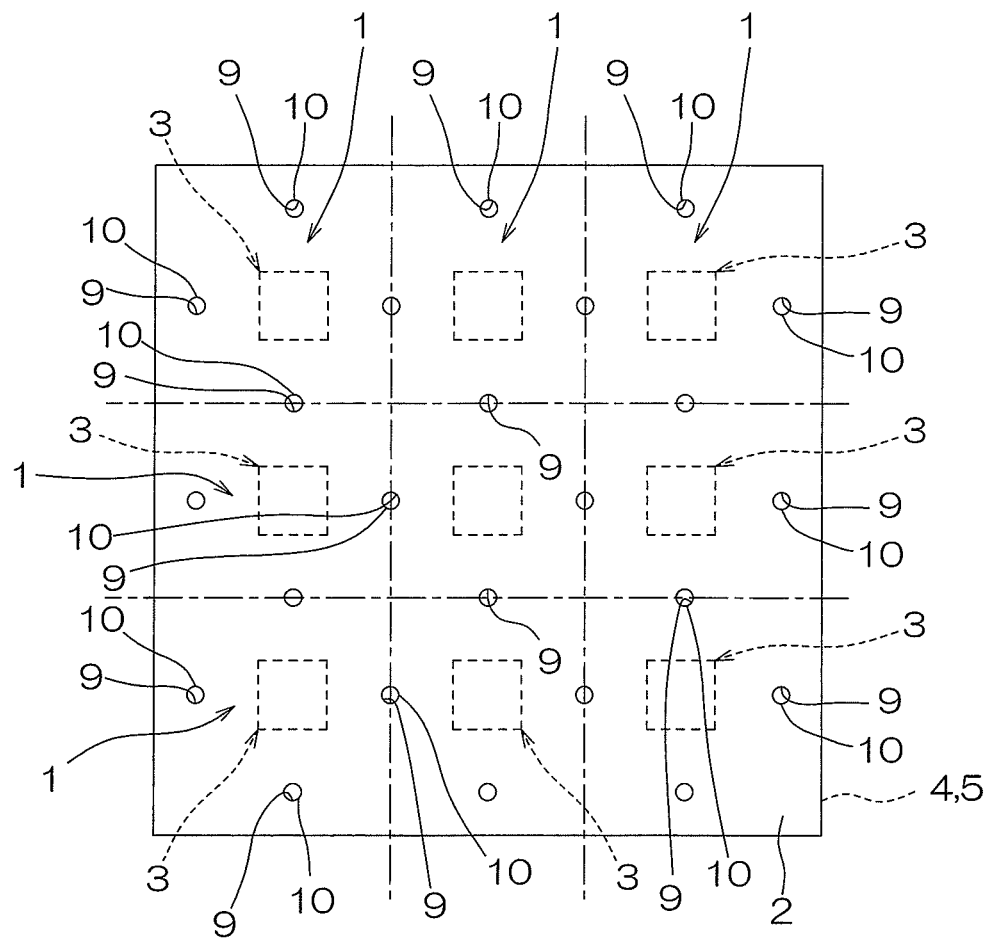
FIG. 1 shows a bottom view of one embodiment of a light emitting diode device of the present invention.
Figure 1:
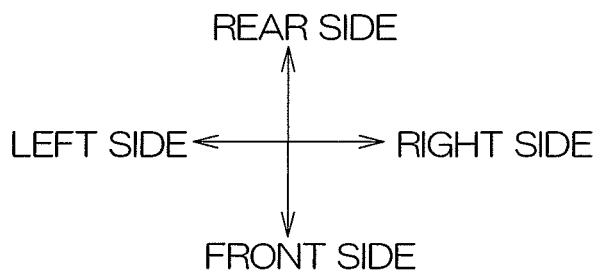

FIG. 1 shows a bottom view of one embodiment of a light emitting diode device of the present invention. FIGS. 2 and 3 show process drawings for illustrating one embodiment of a method for producing the light emitting diode device of the present invention. FIG. 4 shows process drawings for illustrating the steps of preparing the phosphor reflecting sheet in FIG. 2(a). FIG. 5 shows a plan view of the mask disposed in the step in FIG. 4(b).

In FIGS. 1 and 2(c), a light emitting diode device 1 includes a diode board 2 as a substrate, a light emitting diode element 3 flip mounted (flip mounting is also called flip-chip mounting) on the diode board 2, a reflecting resin layer 4 provided at the lateral side of the light emitting diode element 3, and a phosphor layer 5 laminated on the upper surface (one side in a thickness direction, the near side of the paper surface in FIG. 1) of the light emitting diode element 3.

A plurality of the light emitting diode devices 1 are provided to be spaced apart from each other in a plane direction (to be specific, a right-left direction of the paper surface and a front-rear direction of the paper surface shown by the arrows in FIG. 1). That is, a plurality of the light emitting diode devices 1 include the common diode board 2 and the common phosphor layer 5, and a plurality of the light emitting diode elements 3 and the reflecting resin layer 4 provided at the side thereof are provided between one piece of the diode board 2 and one piece of the phosphor layer 5. A plurality of the light emitting diode devices 1 form an assembly sheet 24.

As shown by the dash-dot lines in FIG. 1 and the dash-dot lines in FIG. 3(d), the diode board 2, the reflecting resin layer 4, and the phosphor layer 5, which are located between the light emitting diode elements 3, are subjected to a cutting (dicing) process, so that it is also possible to obtain the individualized light emitting diode devices 1.

As shown in FIGS. 1 and 2(c), the diode board 2 is formed into a generally rectangular flat plate shape. To be specific, the diode board 2 is formed of a laminated board in which a conductive layer, as a circuit pattern, is laminated on an insulating board. The insulating board is formed of, for example, a silicon board, a ceramic board, a polyimide resin board, or the like. Preferably, the insulating board is formed of the ceramic board, to be specific, a sapphire ($Al_2O_3$) board. The conductive layer is formed of, for example, a conductor such as gold, copper, silver, or nickel. The conductors can be used alone or in combination.

As shown in FIG. 2(c), the conductive layer includes a terminal 6.

The terminals 6 are formed at spaced intervals in the plane direction on the upper surface of the insulating board and are formed into a pattern corresponding to electrode portions 8 to be described later. Although not shown, the terminal 6 is electrically connected to an electric power supply portion via the conductive layer.

As shown in FIGS. 1 and 2(c), the diode board 2 is formed with through holes 9 extending therethrough in the thickness direction in a plurality of the light emitting diode devices 1 (the assembly sheet 24) before the light emitting diode elements 3 are individualized.

The through holes 9 are provided corresponding to the light emitting diode elements 3 to be spaced apart from the above-described conductive layer (including the terminals 6) in the plane direction. To be specific, a plurality of the through holes 9 are provided around respective regions where the light emitting diode elements 3 are formed. In detail, the total of four through hole 9 are formed individually on the right, left, front, and rear of each of the regions where the light emitting diode elements 3 are formed. The through holes 9 are opened in generally circular shapes in plane view and are arranged to be aligned in the right-left and front-rear directions.

The through hole 9 has an inner diameter in the range of, for example, 25 to 500 μm, or preferably 50 to 100 μm.

The diode board 2 has a thickness in the range of, for example, 25 to 2000 μm, or preferably 50 to 1000 μm.

The light emitting diode element 3 is provided on the upper surface (one surface in the thickness direction) of the diode board 2 and is formed into a generally rectangular shape in plane view. A plurality of the light emitting diode elements 3 are, on the upper surface of one piece of the diode board 2, arranged to be aligned at spaced intervals to each other in the plane direction (the right-left and front-rear directions).

As shown in FIG. 2(c), each of the light emitting diode elements 3 includes a light semiconductor layer 7 and the electrode portions 8 formed on the lower surfaces thereof.

The light semiconductor layer 7 is formed into a generally rectangular shape in plane view corresponding to the outer shape of the light emitting diode element 3 and is formed into a generally rectangular shape in sectional view that is long in the plane direction.

Although not shown, for example, the light semiconductor layer 7 includes a buffer layer, an N-type semiconductor layer, a light emitting layer, and a P-type semiconductor layer that are successively laminated in a descending order. The light semiconductor layer 7 is formed of a known semiconductor material and is formed by a known growth method such as an epitaxial growth method. The light semiconductor layer 7 has a thickness in the range of, for example, 0.1 to 500 μm, or preferably 0.2 to 200 μm.

The electrode portion 8 is electrically connected to the light semiconductor layer 7 and is formed so as to be included in the light semiconductor layer 7 when projected in the thickness direction. The electrode portion 8 includes, for example, an anode electrode that is connected to the P-type semiconductor layer and a cathode electrode that is formed in the N-type semiconductor layer.

The electrode portion 8 is formed of a known conductive material and has a thickness in the range of, for example, 10 to 1000 nm.

The reflecting resin layer 4 is formed, on the upper surface of the diode board 2, in a region at least other than the regions where the light emitting diode elements 3 (to be specific, the electrode portions 8) are formed when projected in the thickness direction.

That is, the reflecting resin layer 4 is disposed so as to surround the respective side surfaces of the light emitting diode elements 3 and also cover the lower surfaces of the light semiconductor layers 7 exposed from the electrode portions 8.

To be specific, as shown in FIG. 1, the reflecting resin layer 4 is formed into a generally rectangular frame shape on both outer sides of each of the light emitting diode elements 3 in the right-left and front-rear directions. With its frame portion being arranged to be continuously aligned in the right-left and front-rear directions, the reflecting resin layer 4 is formed into a generally grid shape in plane view over the upper surface of one piece of the diode board 2.

As shown in FIG. 2(c), the reflecting resin layer 4 is in close contact with each of the respective outer side surfaces of the light emitting diode elements 3, to be specific, each of the surfaces of the left surface, the right surface, the front surface (ref: FIG. 1), and the rear surface (ref: FIG. 1) of each of the light emitting diode elements 3. In this way, the reflecting resin layer 4 exposes the upper surfaces of the light emitting diode elements 3.

At the lower sides of the light semiconductor layers 7, space 12 (ref: FIG. 2(b)) each corresponding to the thickness of each of the electrode portions 8 are formed and are also filled with the reflecting resin layer 4. In this way, the reflecting resin layer 4 is also in close contact with the lower surfaces of the light semiconductor layers 7 exposed from the electrode portions 8 and the side surfaces of the electrode portions 8.

The upper surface of the reflecting resin layer 4 is formed to be substantially flush with the upper surfaces of the light emitting diode elements 3 in the plane direction.

On the other hand, the portions of the lower surface of the reflecting resin layer 4 which are opposed to the through holes 9 of the diode board 2 face the inner surfaces of the through holes 9 and are formed as protruding portions 10 slightly protruding downward.

The above-described reflecting resin layer 4 contains, for example, a light reflecting component. To be specific, the reflecting resin layer 4 is formed of a reflecting resin composition that contains a resin and the light reflecting component.

An example of the resin includes a thermosetting resin such as thermosetting silicone resin, epoxy resin, thermosetting polyimide resin, phenol resin, urea resin, melamine resin, unsaturated polyester resin, diallyl phthalate resin, and thermosetting urethane resin. Preferably, the thermosetting silicone resin or the epoxy resin is used.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, and zirconium oxide; a carbonate such as white lead (lead carbonate) and calcium carbonate; and a clay mineral such as kaoline (kaolinite).

As the white inorganic pigment, preferably, the oxide is used or more preferably, the titanium oxide is used.

The titanium oxide can have characteristics such as a high degree of whiteness, a high light reflectivity, excellent hiding characteristics (hiding power), excellent coloring characteristics (coloring power), a high dispersibility, an excellent weather resistance, and a high chemical stability.

To be specific, the titanium oxide is $TiO_2$ (titanium oxide (IV), titanium dioxide).

A crystal structure of the titanium oxide is not particularly limited. For example, the crystal structure thereof is rutile, brookite (pyromelane), anatase (octahedrite), or the like. Preferably, the crystal structure thereof is rutile.

A crystal system of the titanium oxide is not particularly limited. For example, the crystal system thereof is a tetragonal system, an orthorhombic system, or the like. Preferably, the crystal system thereof is the tetragonal system.

When the crystal structure and the crystal system of the titanium oxide are rutile and the tetragonal system, respectively, it is possible to effectively prevent a reduction of the reflectance with respect to light (to be specific, visible light, among all, the light around the wavelength of 450 nm) even in a case where the reflecting resin layer 4 is exposed to a high temperature for a long time.

The light reflecting component is in the form of a particle. The shape thereof is not limited and examples of the shape thereof include, for example, a sphere shape, a plate shape, and a needle shape. An average value of the maximum length (in a case of the sphere shape, the average particle size) of the light reflecting component is in the range of, for example, 1 to 1000 nm. The average value of the maximum length is measured by using a laser diffraction scattering particle size analyzer.

The mixing ratio of the light reflecting component per 100 parts by mass of the resin is, for example, 0.5 to 90 parts by mass, or preferably 1.5 to 70 parts by mass from the viewpoint of the coloring characteristics, the light reflectivity, and handling ability of the reflecting resin composition.

The above-described light reflecting component is uniformly dispersed and mixed into the resin.

In addition, a filler can further be added into the reflecting resin composition. That is, the filler can be used in combination with the light reflecting component (to be specific, the white pigment).

An example of the filler includes a known filler, except for the above-described white pigment. To be specific, an inorganic filler is used. Examples thereof include silica powder, talc powder, alumina powder, aluminum nitride powder, and silicon nitride powder.

Preferably, as the filler, the silica powder is used from the viewpoint of reducing a linear expansion coefficient of the reflecting resin layer 4.

Examples of the silica powder include fused silica powder and crystalline silica powder. Preferably, the fused silica powder (that is, silica glass powder) is used.

Examples of the shape of the filler include, for example, a sphere shape, a plate shape, and a needle shape. Preferably, the sphere shape is used from the viewpoint of excellent filling characteristics and fluidity.

Therefore, preferably, the fused silica powder in a sphere shape is used as the silica powder.

The average value of the maximum length (in a case of the sphere shape, the average particle size) of the filler is in the range of, for example, 5 to 60 μm, or preferably 15 to 45 μm. The average value of the maximum length is measured by using the laser diffraction scattering particle size analyzer.

The addition ratio of the filler is adjusted so that the total amount of the filler and the light reflecting component per 100 parts by mass of the resin is, for example, 10 to 80 parts by mass. And the addition ratio of the filler is adjusted so that the total amount of the filler and the light reflecting component per 100 parts by mass of the resin is preferably 25 to 75 parts by mass, or more preferably 40 to 60 parts by mass from the view point of reducing the linear expansion coefficient and ensuring the fluidity.

The above-described resin, light reflecting component, and filler, which is added as required, are blended to be uniformly mixed, so that the reflecting resin composition is prepared.

Also, the reflecting resin composition is prepared in a B-stage state.

The reflecting resin composition is formed, for example, in a state of liquid or semi-solid and has a kinetic viscosity in the range of, for example, 10 to 30 $mm^2/s$.

The thickness of the reflecting resin layer 4 (the portion thereof except for the protruding portions 10) is substantially the same as that of the light emitting diode element 3. The protruding length of the protruding portion 10 is adjusted to an appropriate value in accordance with the degree of depressurization (pressure) in each of the through holes 9 described later, which is in the range of, for example, 20 to 100% with respect to, for example, the thickness of the diode board 2.

As shown in FIGS. 1 and 2(c), the phosphor layer 5 is formed into a generally rectangular sheet (film) shape in plane view corresponding to the outer shape of the assembly sheet 24 and is formed over the entire upper surfaces (one surfaces in the thickness direction) of the light emitting diode elements 3 and the reflecting resin layer 4.

The phosphor layer 5 is formed of, for example, a phosphor composition that contains a phosphor.

The phosphor composition contains, for example, the phosphor and a resin.

An example of the phosphor includes a yellow phosphor that is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include garnet type phosphor having a garnet type crystal structure such as $Y_3Al_5O_{12}$:Ce (YAG (yttrium aluminum garnet):Ce), $(Y,Gd)_3Al_5O_{12}$:Ce, $Tb_3Al_3O_{12}$:Ce, $Ca_3Sc_2Si_3O_{12}$:Ce, and $Lu_2CaMg_2(Si,Ge)_3O_{12}$:Ce; silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; aluminate phosphor such as $CaAl_{12}O_{19}$: Mn and $SrAl_2O_4$:Eu; sulfide phosphor such as ZnS:Cu, Al, CaS:Eu, $CaGa_2S_4$:Eu, and $SrGa_2S_4$:Eu; oxynitride phosphor such as $CaSi_2O_2N_2$:Eu, $SrSi_2O_2N_2$:Eu, $BaSi_2O_2N_2$:Eu, and Ca-α-SiAlON; nitride phosphor such as $CaAlSiN_3$:Eu and $CaSi_5N_8$:Eu; and fluoride-based phosphor such as $K_2SiF_6$: Mn and $K_2TiF_6$:Mn. Preferably, garnet type phosphor is used, or more preferably, $Y_3Al_5O_{12}$:Ce (YAG) is used.

The phosphors can be used alone or in combination of two or more.

The mixing ratio of the phosphor with respect to the phosphor composition is, for example, 1 to 50 mass %, or preferably 5 to 30 mass %. The mixing ratio of the phosphor is, for example, 1 to 100 parts by mass, or preferably 5 to 40 parts by mass per 100 parts by mass of a resin.

The resin is a matrix in which the phosphor is dispersed, including, for example, transparent resins such as silicone resin, epoxy resin, and acrylic resin. Preferably, the silicone resin is used from the viewpoint of durability.

The silicone resin has, in its molecule, a main chain mainly composed of the siloxane bond (—Si—O—Si—) and a side chain, which is bonded to silicon atoms (Si) of the main chain, composed of an organic group such as an alkyl group (for example, a methyl group and the like) or an alkoxyl group (for example, a methoxy group).

To be specific, examples of the silicone resin include dehydration condensation type silicone resin, addition reaction type silicone resin, peroxide curable silicone resin, moisture curable silicone resin, and curable silicone resin. Preferably, the addition reaction type silicone resin is used.

The silicone resin has a kinetic viscosity at 25° C. in the range of, for example, 10 to 30 $mm^2$/s.

The resins can be used alone or in combination of two or more.

The mixing ratio of the resin is, for example, 50 to 99 mass %, or preferably 70 to 95 mass % with respect to the phosphor composition.

The phosphor and the resin are blended at the above-described mixing ratio and are stirred and mixed, so that the phosphor composition is prepared.

The phosphor layer 5 can also be formed of, for example, a ceramic of a phosphor (phosphor ceramic plate). In that case, the above-described phosphor is used as a ceramic material and by sintering such a ceramic material, the phosphor layer 5 (phosphor ceramic) is obtained.

The phosphor layer 5 has a thickness in the range of, for example, 100 to 1000 μm, preferably 200 to 700 μm, or more preferably 300 to 500 μm.

Next, a method for producing the light emitting diode device 1 described above is described with reference to FIGS. 1 to 5.

In this method, as shown in FIG. 2(a), a phosphor reflecting sheet 13 is first prepared.

The phosphor reflecting sheet 13 is a laminated sheet for providing the phosphor layer 5 on (one side in the thickness direction of) the light emitting diode elements 3 (ref: FIG. 2(b)) and providing the reflecting resin layer 4 on the lateral sides of the light emitting diode elements 3.

The phosphor reflecting sheet 13 includes the phosphor layer 5 and the reflecting resin layer 4 provided on the upper surface (one surface in the thickness direction) of the phosphor layer 5.

The phosphor reflecting sheet 13 is prepared by providing the reflecting resin layer 4 on the upper surface (one surface in the thickness direction) of the phosphor layer 5.

To provide the reflecting resin layer 4 on the upper surface of the phosphor layer 5, for example, as shown in FIG. 4(a), the phosphor layer 5 is first prepared.

To prepare the phosphor layer 5, when the phosphor layer 5 is formed of a phosphor composition, for example, the above-described phosphor composition is applied onto the entire upper surface of the first release substrate 21 shown by the phantom lines to form a phosphor film (not shown).

The first release substrate 21 is formed of a resin material and the like such as a vinyl polymer including polyolefin (to be specific, polyethylene and polypropylene) and ethylene-vinyl acetate copolymer (EVA); a polyester including polyethylene terephthalate and polycarbonate; and a fluorine resin including polytetrafluoroethylene. The first release substrate 21 is also formed of a metal material such as iron, aluminum, or stainless steel. The first release substrate 21 has a thickness in the range of, for example, 10 to 1000 μm.

After the phosphor composition is applied onto the first release substrate 21, the formed phosphor film is heated at, for example, 50 to 150° C. to be dried, so that the phosphor layer 5 in a sheet state is obtained.

Alternatively, when the phosphor layer 5 is formed of a ceramic of a phosphor (phosphor ceramic plate), for example, the above-described phosphor is used as a ceramic material, which is formed into a sheet state, and then is sintered to obtain the phosphor layer 5 (phosphor ceramic) in a sheet state.

Next, as shown in FIG. 4(b), a mask 20 is disposed on the phosphor layer 5.

As shown in FIG. 5, the mask 20 is formed into a pattern of integrally including a frame portion 17, a covering portion 18 that is disposed at spaced intervals to the inner side of the frame portion 17 in the plane direction, and a bridge portion 19 that is disposed between the frame portion 17 and the covering portion 18.

The frame portion 17 is formed into a generally rectangular frame shape in plane view. The frame portion 17 is formed to have a width that can support the covering portion 18 via the bridge portion 19 (a width capable of ensuring strength).

A plurality of the covering portions 18 are disposed at spaced intervals to each other so as to correspond to the above-described light emitting diode elements 3 (ref: dashed lines in FIG. 1). That is, each of the covering portions 18 is formed independently.

Each of the covering portions 18 is formed to have an outer shape (to be specific, a generally rectangular shape in plane view) corresponding to the outer shape of each of the light emitting diode elements 3 (ref: the dashed lines in FIG. 1) in plane view.

The bridge portion 19 is disposed between the frame portion 17 and the covering portion 18, and is also disposed between the covering portions 18 that are adjacent to each other in the plane direction. Each of the bridge portions 19 is formed into a generally X-shape in plane view and is, for example, disposed between four pieces of the covering portions 18 (18A, 18B, 18C, and 18D) that are adjacent to each other in the plane direction so as to connect the end portions thereof in the right-left and front-rear directions.

The bridge portion 19 is, for example, formed of a linear member such as a wire. The bridge portion 19 is formed to have a width that is significantly narrow with respect to that of the covering portion 18. To be specific, the width thereof is in the range of, for example, 100 μm or less, or preferably 50 μm or less, and usually, for example, 25 μm or more.

The mask 20 is formed of a metal material such as stainless steel and iron or a resin material such as polyethylene terephthalate. Preferably, the mask 20 is formed of the metal material.

The mask 20 is formed into the above-described pattern by, for example, a known pattern forming method such as an etching or a laser processing.

The mask 20 has a thickness in the range of, for example, 25 to 500 μm.

As shown in FIG. 4(*b*), the above-described mask 20 is disposed (placed) on the upper surface of the phosphor layer 5 such that the covering portions 18 and the phosphor layer 5 (ref: FIGS. 1 and 2(*b*)) corresponding to the light emitting diode elements 3 are disposed in opposed relation to each other in the thickness direction.

Next, in this method, as shown in FIG. 4(*c*), the reflecting resin composition is applied onto the phosphor layer 5 via the mask 20.

In the application of the reflecting resin composition, for example, an application method such as a printing and a dispenser is used.

In this way, a reflecting film 22 made of the reflecting resin composition is formed on the upper surface of the phosphor layer 5 in a pattern reverse to that of the mask 20.

Subsequently, as shown by the arrows in the phantom lines in FIG. 4(*c*), the mask 20 is removed from the phosphor layer 5. To be specific, the mask 20 is pulled toward the upper side.

By pulling the mask 20 toward the upper side, the reflecting film 22 formed on the upper surfaces of the covering portions 18 is removed.

By the above-described pulling up of the mask 20, the reflecting film 22 around the bridge portions 19 (ref: FIG. 5) (to be specific, the reflecting resin composition formed on the side surfaces of the bridge portions 19) slightly moves fluidly, so that the regions where the bridge portions 19 are disposed are covered (filled in) with the reflecting film 22 without being exposed.

In this way, as shown in FIGS. 2(*a*) and 4(*d*), the reflecting film 22 is formed in a pattern reverse to that of the covering portion 18 (ref: FIG. 4(*c*)).

In this way, the reflecting resin layer 4 made of the reflecting film 22 in the above-described pattern is obtained.

The reflecting film 22 in the above-described pattern is heated, so that the reflecting resin layer 4 is brought into a B-stage state.

The heating conditions include a heating temperature in the range of, for example, 40 to 150° C., or preferably 50 to 140° C. and a heating time in the range of, for example, 1 to 60 minutes, or preferably 3 to 20 minutes.

As referred in the dashed lines in FIG. 2(*b*) described later, the reflecting resin layer 4 is formed in a pattern such that, when the phosphor reflecting sheet 13 is turned over upside down and the turned over phosphor reflecting sheet 13 is disposed in opposed relation to the diode board 2, the lower surface of the phosphor layer 5 exposed from the reflecting resin layer 4 includes the light emitting diode elements 3 when projected in the thickness direction. As referred in FIG. 2(*c*) described later, the reflecting resin layer 4 is also formed in a pattern corresponding to the light emitting diode elements 3 such that, when the phosphor reflecting sheet 13 is laminated on the diode board 2, the reflecting resin layer 4 is disposed in opposed relation to the side surfaces of the light emitting diode elements 3.

Thereafter, when the phosphor layer 5 is formed of a phosphor composition, as shown by the arrow in the phantom lines in FIG. 4(*d*), the first release substrate 21 is peeled off from the phosphor layer 5.

In this way, as shown in the upper portion in FIG. 2(*b*), the phosphor reflecting sheet 13 including the reflecting resin layer 4 and the phosphor layer 5 is prepared.

Separately, in this method, as shown in the lower portion in FIG. 2(*b*), the diode board 2 is prepared and the light emitting diode elements 3 are provided on the upper surface (one surface in the thickness direction) of the prepared diode board 2.

To prepare the diode board 2, the conductive layer including the terminals 6 is formed on the insulating board in a generally rectangular shape in plane view.

To provide the light emitting diode elements 3 on the diode board 2, the electrode portions 8 and the terminals 6 are electrically connected to flip-chip mount the light emitting diode elements 3 on the diode board 2.

In addition, the through holes 9 are formed in the diode board 2.

The through holes 9 are formed so as to extend through the diode board 2 in the thickness direction by a boring method such as an etching or drilling perforation.

Next, in this method, as shown in FIG. 2(*b*), the phosphor reflecting sheet 13 is disposed in opposed relation to the upper side of the diode board 2.

To be specific, the phosphor reflecting sheet 13 is first turned over upside down from the state shown in FIG. 2(*a*).

Subsequently, the phosphor reflecting sheet 13 is disposed such that the reflecting resin layer 4 is opposed to the through holes 9 and the phosphor layer 5 exposed from the reflecting resin layer 4 is opposed to the upper surfaces (one surfaces in the thickness direction) of the light emitting diode elements 3.

Subsequently, in this method, as shown in FIG. 2(*c*), the phosphor reflecting sheet 13 is laminated on the diode board 2.

To be specific, the lower surface of the reflecting resin layer 4 is brought into contact with the diode board 2 around the through holes 9, while the phosphor layer 5 is brought into contact with the upper surfaces of the light emitting diode elements 3.

In this way, both of the reflecting resin layer 4 and the light emitting diode elements 3 are sandwiched between the phosphor layer 5 and the diode board 2 in the thickness direction.

In addition, parts of the lower surface of the reflecting resin layer 4 face the through holes 9.

Thereafter, in this method, the reflecting resin layer 4 is pressed.

To be specific, the reflecting resin layer 4 is pressed in the thickness direction via the phosphor layer 5 and/or the diode board 2. As a result, since the reflecting resin layer 4 is sandwiched between the phosphor layer 5 and the diode board 2, the pressing force applied to the reflecting resin layer 4 in the thickness direction transmits to the side, to be specific, outwardly (leftwardly, rightwardly, forwardly, and rearwardly) in the plane direction. In this way, the reflecting resin layer 4 comes in close contact with the respective side surfaces (the left surfaces, the right surfaces, the front surfaces, and the rear surfaces) of the light emitting diode elements 3.

At this time, the reflecting resin layer 4 also fills the space 12 (ref: FIG. 2(*b*)) formed at the lower side of the light semiconductor layers 7 corresponding to the thickness of each of the electrode portions 8. In this way, the reflecting resin layer 4 comes in close contact with the lower surfaces of the light semiconductor layers 7 and the side surfaces of the electrode portions 8.

Simultaneously with the pressing of the reflecting resin layer 4 described above, the pressure in each of the through holes 9 is reduced.

To be specific, each of the through holes 9 is connected to a suction pump (or a pressure reducing pump or a vacuum pump) not shown via a connecting member not shown to be brought into a pressure-reduced state. An atmospheric pressure in each of the through holes 9 is in the range of, for example, 300 to 2000 Pa, or preferably 300 to 1000 Pa.

By reducing the pressure in each of the through holes 9, the portions of the reflecting resin layer 4 facing the through holes 9 enter (are pulled into) the through holes 9 to form the protruding portions 10 in the through holes 9. At the same time, the reflecting resin layer 4 (the upper end portion thereof) in close contact with the side surfaces of the light emitting diode elements 3 is prevented from fluidly moving into the space between the light emitting diode elements 3 and the phosphor layer 5.

In this way, as shown in FIG. 1, the assembly sheet 24 including a plurality of the light emitting diode devices 1 arranged in alignment is obtained.

Thereafter, as shown by the dash-dot lines in FIG. 1 and the dash-dot lines in FIG. 3(d), the diode board 2, the reflecting resin layer 4, and the phosphor layer 5, which are located between the light emitting diode elements 3 adjacent to each other, are subjected to a cutting (dicing) process along the thickness direction. To be specific, the diode board 2, the reflecting resin layer 4, and the phosphor layer 5 are subjected to a cutting process in the thickness direction so as to equally halve each of the through holes 9 along a line segment connecting the individual through holes 9 aligned in the right-left direction and a line segment connecting the individual through holes 9 adjoining in the front-rear direction.

In this way, the light emitting diode elements 3 are cut into plural pieces. That is, the light emitting diode elements 3 are individualized (singulated).

In this way, as shown in FIG. 3(e), the light emitting diode devices 1 including the individualized light emitting diode elements 3 are obtained.

In the above-described method, the reflecting resin layer 4 is brought into close contact with the side surfaces of the light emitting diode elements 3. Therefore, in the obtained light emitting diode device 1, light emitted from the light emitting diode element 3 to the side is reflected by the reflecting resin layer 4 before being absorbed by another member.

Since the phosphor layer 5 is disposed in opposed relation to the upper surface of the light emitting diode element 3, high-energy white light can be emitted by color mixing of the blue light emitted from the light emitting diode element 3 upward transmitting through the phosphor layer 5 and the yellow light that is converted in wavelength by the phosphor layer 5.

Also, according to this method, the pressure in each of the through holes 9 is reduced. Therefore, it is possible to prevent the reflecting resin layer 4 from fluidly moving into regions located over the light emitting diode elements 3. This allows the phosphor layer 5 to be reliably laminated on the upper surfaces of the light emitting diode elements 3.

In addition, by reducing the pressure in each of the through holes 9 described above, air bubbles (voids) in the reflecting resin layer 4 can be removed. Therefore, it is possible to form the reflecting resin layer 4 with excellent reliability. In this way, the light can be efficiently reflected by the reflecting resin layer 4.

As a result, the extraction efficiency of the light can be improved.

In the embodiments in FIGS. 4(b) to 4(d), the reflecting resin layer 4 is formed using the mask 20. Alternatively, for example, when the resin is in the form of a powder, the resin composition is formed on the entire upper surface of the phosphor layer 5 by being heated and subjected to compression molding to be cured with a compression molding machine. Thereafter, the reflecting resin layer 4 can be formed into the above-described pattern by an etching and the like.

Also, in the embodiments in FIGS. 2 and 3, the substrate in the producing method of the light emitting diode device of the present invention is described as the diode board 2. Alternatively, for example, as shown in FIGS. 6 and 7, it is also possible to obtain the light emitting diode devices 1 by using a second release substrate 23 as the substrate and separately preparing the diode board 2 (ref: FIG. 7(f)).

FIGS. 6 and 7 show process drawings for illustrating another embodiment (a method using a second release substrate) of a method for producing the light emitting diode device of the present invention.

In FIGS. 6 and 7, the same reference numerals are provided for members corresponding to each of those described above, and their detailed description is omitted.

Next, a method for producing the light emitting diode device 1 using the second release substrate 23 is described with reference to FIGS. 6 and 7.

In this method, as shown in FIG. 6(a), the second release substrate (release substrate) 23 as the substrate is first prepared.

The second release substrate 23 is formed of the same material as that for the first release substrate 21 described above (ref: the phantom lines in FIGS. 4(a) to 4(d)). The second release substrate 23 can also be formed of a thermal release sheet that can be easily peeled off from the light emitting diode elements 3 by being heated. As shown in the phantom lines in FIG. 6(a), for example, the thermal release sheet includes a supporting layer 15 and a pressure-sensitive adhesive layer 16 laminated on the upper surface of the supporting layer 15.

The supporting layer 15 is formed of, for example, a heat resistant resin such as polyester.

The pressure-sensitive adhesive layer 16 is formed of, for example, a thermally expandable pressure-sensitive adhesive and the like, which has adhesion under normal temperature (25° C.), and in which the adhesion is reduced (or lost) at the time of being heated.

A commercially available product can be used as the above-described thermal release sheet. To be specific, REVALPHA (a trade name, manufactured by NITTO DENKO CORPORATION) and the like can be used.

The thermal release sheet reliably supports the light emitting diode elements 3 (ref: FIG. 6(b)) by the supporting layer 15 via the pressure-sensitive adhesive layer 16 and is peeled off from the light emitting diode elements 3 due to a reduction in the adhesion of the pressure-sensitive adhesive layer 16 by the heating and thermal expansion performed thereafter.

The second release substrate 23 has a thickness in the range of, for example, 10 to 1000 μm.

Next, as shown in the lower portion in FIG. 6(b), the light emitting diode elements 3 are provided on the upper surface of the second release substrate 23.

The through holes 9 are formed in the second release substrate 23. The through holes 9 are formed so as to extend through the second release substrate 23 in the thickness direction by a boring method such as an etching or drilling perforation.

Next, as shown in FIG. 6(b), the phosphor reflecting sheet 13 is disposed in opposed relation to the upper side of the second release substrate 23.

Subsequently, in this method, as shown in FIG. 6(c), the phosphor reflecting sheet 13 is laminated on the second release substrate 23.

Thereafter, the reflecting resin layer 4 is pressed, while the pressure in each of the through holes 9 is reduced.

Then, in this method, as shown by the dash-dot lines in FIG. 7(d), the second release substrate 23, the reflecting resin layer 4, and the phosphor layer 5, which are located between the light emitting diode elements 3 adjacent to each other, are subjected to a cutting (dicing) process along the thickness direction. To be specific, the second release substrate 23, the reflecting resin layer 4, and the phosphor layer 5 are subjected to a cutting process in the thickness direction so as to equally halve each of the through holes 9 along the line segments connecting the individual through holes 9.

In this way, the light emitting diode elements 3 are cut into plural pieces. That is, the light emitting diode elements 3 are individualized (singulated).

Thereafter, in this method, as shown by the phantom lines in FIG. 7(e), the second release substrate 23 is peeled off from the light emitting diode elements 3 and the reflecting resin layer 4. When the second release substrate 23 is a thermal release sheet, the second release substrate 23 is peeled off from the light emitting diode elements 3 and the reflecting resin layer 4 by being heated.

In this way, the light emitting diode elements 3 having the side surfaces thereof in close contact with the reflecting resin layer 4 and the upper surfaces thereof laminated on the phosphor layer 5 are obtained.

Thereafter, as shown in FIG. 7(f), the light emitting diode elements 3 are flip mounted on the diode board 2.

In this way, the light emitting diode devices 1 are obtained.

In this method, the second release substrate 23 is peeled off from the light emitting diode elements 3 and the reflecting resin layer 4 and the light emitting diode elements 3 having the side surfaces thereof in close contact with the reflecting resin layer 4 and the upper surfaces thereof laminated on the phosphor layer 5 are flip mounted on the diode board 2. Therefore, it is possible to easily and reliably produce the light emitting diode devices 1.

On the other hand, in the embodiments in FIGS. 2 and 3, the light emitting diode elements 3 are flip mounted on the diode board 2 and the reflecting resin layer 4 comes in close contact with the side surfaces of the light emitting diode elements 3. Accordingly, there is no use of the second release substrate 23 (FIGS. 6 and 7) and no peeling off thereof from the light emitting diode elements 3 and the reflecting resin layer 4. Therefore, it is possible to easily produce the light emitting diode devices 1 (and the assembly sheet 24).

EXAMPLES

While the present invention will be described hereinafter in further detail with reference to Examples, the present invention is not limited to these Examples.

Example 1

The Embodiments in FIGS. 2 and 3

First, a phosphor reflecting sheet was prepared (ref: FIG. 2(a)).

That is, a first release substrate made of polyethylene terephthalate having a thickness of 50 μm was first prepared.

Then, 26 parts by mass of phosphor particles composed of $Y_3Al_5O_{12}$:Ce (in a sphere shape, the average particle size of 8 μm) and 74 parts by mass of a silicone resin (addition reaction type silicone resin, kinetic viscosity (at 25° C.) of 20 mm$^2$/s, manufactured by WACKER ASAHIKASEI SILICONE CO., LTD.) were blended and stirred uniformly, so that a phosphor composition was prepared. The phosphor composition was applied onto the entire upper surface of the prepared first release substrate to form a phosphor film. Then, the phosphor film was dried at 100° C. to form a phosphor layer on the entire upper surface of the first release substrate (ref: FIG. 4(a)).

Then, a mask made of stainless steel having a thickness of 100 μm was disposed on the upper surface of the phosphor layer (ref: FIG. 4(b)). The mask was formed into a pattern of integrally including a frame portion, a covering portion, and a bridge portion (ref: FIG. 5).

Then, 100 parts by mass of thermosetting silicone resin and 20 parts by mass of a particle of titanium oxide ($TiO_2$: tetragonal system of rutile) in a sphere shape having an average particle size of 300 nm were uniformly mixed, so that a reflecting resin composition was prepared. The prepared reflecting resin composition was applied onto the phosphor layer by a printing via the mask (ref: FIG. 4(c)).

In this way, a reflecting film made of the reflecting resin composition was formed in a pattern reverse to that of the mask.

Subsequently, the mask was removed from the phosphor layer (ref: the arrows in the phantom lines in FIG. 4(c)). In this way, the reflecting film around the bridge portions slightly moved fluidly to fill the regions where the bridge portions were located. Thus, the reflecting film was formed in a pattern reverse to that of the covering portions. The reflecting film was brought into a B-stage state by being heated.

Thereafter, the first release substrate was peeled off from the phosphor layer (ref: the arrows in the phantom lines in FIG. 4(d)).

In this way, the phosphor reflecting sheet (laminated sheet) including the phosphor layer and a reflecting resin layer formed of the reflecting film was prepared (ref: FIG. 2(a)).

Then, the phosphor reflecting sheet was turned over upside down (ref: the upper portion in FIG. 2(b)).

Separately, light emitting diode elements each having a thickness of 0.1 mm and including a light semiconductor layer including a buffer layer (GaN); an N-type semiconductor layer (n-GaN); a light emitting layer (InGaN); and a P-type semiconductor layer (p-GaN:Mg) and an electrode portion including an anode electrode and a cathode electrode were flip mounted on the upper surface of a diode board having a thickness of 1 mm (ref: the lower portion in FIG. 2(b)). The diode board included an insulating board made of sapphire and a conductive layer including a terminal made of copper, nickel, and gold on the upper surface thereof.

Additionally, through holes each in a circular shape in plane view having an inner diameter of 100 μm were formed in the diode board and around the light emitting diode elements by drilling perforation.

Thereafter, the turned over phosphor reflecting sheet was disposed in opposed relation to the upper side of the diode board such that the reflecting resin layer was opposed to the through holes and the phosphor layer was opposed to the upper surfaces of the light emitting diode elements (ref: FIG. 2(b)).

Subsequently, the phosphor reflecting sheet was laminated on the diode board (ref: FIG. 2(c)).

To be specific, the lower surface of the reflecting resin layer was brought into contact with the diode board around the through holes and the phosphor layer was brought into contact with the upper surfaces of the light emitting diode elements.

Subsequently, the reflecting resin layer was pressed, while the pressure in each of the through holes was reduced to 300 Pa.

In this way, the reflecting resin layer came in close contact with the side surfaces of the light emitting diode elements, while the portions of the reflecting resin layer facing the through holes were pulled into the through holes to form protruding portions.

In this way, an assembly sheet including a plurality of diode devices arranged in alignment was obtained (ref: FIG. 1).

Thereafter, the diode board, the reflecting resin layer, and the phosphor layer, which were located between the light emitting diode elements adjacent to each other, were subjected to a cutting process so as to equally halve each of the through holes along line segments connecting the individual through holes (ref: the dash-dot lines in FIG. 1 and the dash-dot lines in FIG. 3(d)). In this way, the light emitting diode elements were cut into plural pieces to be individualized.

In this way, the light emitting diode devices including the individualized light emitting diode elements were obtained (ref: FIG. 3(e)).

Example 2

The Embodiments in FIGS. 6 and 7

A second release substrate formed of a thermal release sheet (a trade name "REVALPHA", manufactured by NITTO DENKO CORPORATION) having a thickness of 100 μm was prepared (ref: FIG. 6(a)).

Then, light emitting diode elements each having a thickness of 0.1 mm and including a light semiconductor layer including a buffer layer (GaN); an N-type semiconductor layer (n-GaN); a light emitting layer (InGaN); and a P-type semiconductor layer (p-GaN:Mg) and an electrode portion including an anode electrode and a cathode electrode were provided on the upper surface of the second release substrate (ref: the lower portion in FIG. 6(b)).

Additionally, through holes each in a circular shape in plane view having an inner diameter of 100 μm were formed in the second release substrate by drilling perforation.

Subsequently, a phosphor reflecting sheet was prepared (ref: the upper portion in FIG. 6(b)).

That is, in the same manner as in Example 1, a reflecting resin composition was first applied onto the upper surface of a phosphor layer prepared according to the following description via the mask to prepare the phosphor reflecting sheet (laminated sheet) including the phosphor layer and a reflecting resin layer.

<Preparation of Phosphor Layer>

4 g of phosphor particles composed of $Y_3Al_5O_{12}$:Ce (in a sphere shape, the average particle size of 95 nm); 0.21 g of poly(vinyl butyl-co-vinyl alcohol co vinyl alcohol) (manufactured by Sigma-Aldrich Co., the weight average molecular weight of 90000 to 120000) serving as a binder resin; 0.012 g of silica powder (manufactured by Cabot Corporation, a trade name "CAB-O-SIL HS-5") serving as a sintering aid; and 10 mL of methanol were mixed in a mortar to provide a slurry. From the obtained slurry, methanol was removed using a drier to obtain dry powder.

With 700 mg of the dry powder, a uniaxial press mold die of 20 mm×30 mm size was filled. Then, the dry powder was pressed at a pressure of about 10 tons using a hydraulic pressing machine to obtain a green body in a plate shape molded in a rectangular shape having a thickness of about 350 μm.

The obtained green body was heated in air at a temperature rising rate of 2° C./min to reach the temperature of 800° C. in a tubular electric furnace made of alumina so that an organic component such as the binder resin was decomposed/removed, followed by the evacuation of the electric furnace using a rotary pump and 5-hour heating at 1500° C. In this way, a phosphor layer formed of a ceramic plate (YAG-CP) of a YAG:Ce phosphor having a thickness of about 280 μm was prepared.

The phosphor reflecting sheet (laminated sheet) prepared by the description above was laminated on the second release substrate. Then, the reflecting resin layer was pressed, while the pressure in each of the through holes was reduced to 300 Pa (ref: FIG. 7(d)).

Then, the second release substrate, the reflecting resin layer, and the phosphor layer, which were located between the light emitting diode elements adjacent to each other, were subjected to a dicing process so as to equally halve each of the through holes along line segments connecting the individual through holes. In this way, the light emitting diode elements were cut into plural pieces to be individualized (ref: the dash-dot lines in FIG. 7(d)).

Then, the second release substrate was peeled off from the light emitting diode elements and the reflecting resin layer by being heated (ref: the phantom lines in FIG. 7(e)).

Thereafter, the light emitting diode elements having the side surfaces thereof in close contact with the reflecting resin layer and the upper surfaces thereof laminated on the phosphor layer were flip mounted on a light emitting diode board including an insulating board made of sapphire and a conductive layer including a terminal made of copper, nickel, and gold on the upper surface thereof (ref: FIG. 7(f)).

In this way, the light emitting diode devices were obtained (ref: FIG. 7(f)).

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A phosphor reflecting sheet, for providing a phosphor layer on one side in a thickness direction of a light emitting diode element and providing a reflecting resin layer at the side of the light emitting diode element, comprising:

the phosphor layer is continuous without a space in a direction perpendicular to the thickness direction, the reflecting resin layer is provided on an upper surface of the phosphor layer and is provided with a plurality of through holes, side surfaces of the reflecting resin layer around each through hole of the plurality of through holes are exposed, the upper surface of the phosphor layer is exposed from each through hole of the plurality of through holes, and a release substrate is provided on a lower surface of the phosphor layer, wherein the reflecting resin layer is in a semi-solid state, and the release substrate is made of a resin material, has a thickness of 10 to 1000 μm, is flexible, and is configured to curvilinearly peel off from the phosphor layer.

2. The phosphor reflecting sheet according to claim 1, wherein the reflecting resin layer is in a B-stage state.

3. The phosphor reflecting sheet according to claim 1, wherein the reflecting resin layer is provided only on the upper surface of the phosphor layer.

4. The phosphor reflecting sheet according to claim 1, wherein the reflecting resin layer is formed into a grid shape in a plane view.

5. A kit comprising:
a light emitting diode element; and
a phosphor reflecting sheet for providing a phosphor layer on one side in a thickness direction of the light emitting diode element and providing a reflecting resin layer at the side of the light emitting diode element,
wherein the light emitting diode element includes an electrode portion disposed on a lower surface thereof, and
the phosphor reflecting sheet includes:
the phosphor layer that is continuous without space in a direction perpendicular to the thickness direction,
the reflecting resin layer is provided on an upper surface of the phosphor layer and is provided with a plurality of through holes,
side surfaces of the reflecting resin layer around each through hole of the plurality of through holes are exposed,
the upper surface of the phosphor layer is exposed from each through hole of the plurality of through holes, and
the reflecting resin layer is in a semi-solid state corresponding to the light emitting diode element, and
wherein the kit includes the light emitting diode element and the phosphor reflecting sheet as separate components.

6. The kit according to claim 5, wherein the light emitting diode element is configured to be flip-chip mounted on a diode board.

\* \* \* \* \*